United States Patent
Liao et al.

(10) Patent No.: US 10,872,794 B2
(45) Date of Patent: Dec. 22, 2020

(54) AUTOMATIC IN-LINE INSPECTION SYSTEM

(71) Applicant: Taiwan Semiconductor Manufacturing Co., Ltd., Hsin-Chu (TW)

(72) Inventors: Chien-Ko Liao, Taichung (TW); Hsu-Shui Liu, Pingjhen (TW); Jiun-Rong Pai, Jhubei (TW); Sheng-Hsiang Chuang, Hsinchu (TW); Shou-Wen Kuo, Hsinchu (TW); Ya Hsun Hsueh, Yunlin County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 127 days.

(21) Appl. No.: 16/058,400

(22) Filed: Aug. 8, 2018

(65) Prior Publication Data

US 2018/0366357 A1 Dec. 20, 2018

(51) Int. Cl.
*H01L 21/673* (2006.01)
*H01L 21/67* (2006.01)
(Continued)

(52) U.S. Cl.
CPC ...... *H01L 21/67288* (2013.01); *G06T 7/0004* (2013.01); *G06T 7/0008* (2013.01);
(Continued)

(58) Field of Classification Search
CPC ......... H01L 21/67288; H01L 21/68707; G06T 7/0004; G06T 7/0008; H04N 5/2256
See application file for complete search history.

(56) References Cited

U.S. PATENT DOCUMENTS

2005/0023491 A1* 2/2005 Young ............... G01N 21/9503
250/559.42
2007/0087530 A1* 4/2007 Yim ................ H01L 21/76871
438/458
(Continued)

FOREIGN PATENT DOCUMENTS

CN 101622525 A 1/2010
TW 201604609 A 2/2016

OTHER PUBLICATIONS

Official Action dated Aug. 16, 2019, in corresponding Taiwan Patent Application No. 10820777480.

*Primary Examiner* — Mishawn N. Hunter
(74) *Attorney, Agent, or Firm* — Duane Morris LLP

(57) ABSTRACT

A system and method for inline detection of defects on a semiconductor wafer surface during a semiconductor device manufacturing process is disclosed herein. In one embodiment, a method includes: automatically transporting the wafer from a first processing station to an inspection station; scanning a wafer surface using a camera in the inspection station; generating at least one image of the wafer surface; analyzing the at least one image to detect defects on the wafer surface based on a set of predetermined criteria; if the wafer is determined to be defective, automatically transporting the wafer from the inspection station to a stocker; and if the wafer is determined to be not defective, automatically transporting the wafer to a second processing station for further processing in accordance with the semiconductor device manufacturing process.

20 Claims, 10 Drawing Sheets

(51) Int. Cl.
  *H01L 21/687* (2006.01)
  *H04N 5/225* (2006.01)
  *G06T 7/00* (2017.01)

(52) U.S. Cl.
  CPC ..... *H01L 21/68707* (2013.01); *H04N 5/2256* (2013.01); *G06T 2207/30148* (2013.01)

(56) References Cited

U.S. PATENT DOCUMENTS

| | | | |
|---|---|---|---|
| 2009/0278923 A1* | 11/2009 | Endo | G01N 21/956 348/79 |
| 2009/0315988 A1 | 12/2009 | Fukazawa | |
| 2010/0067780 A1* | 3/2010 | Kawaragi | B81C 99/005 382/149 |
| 2013/0044316 A1* | 2/2013 | Gastaldo | G01N 21/47 356/237.2 |
| 2014/0167143 A1 | 6/2014 | Schmidt | |
| 2014/0267692 A1* | 9/2014 | Hu-Wei | G01N 21/9501 348/126 |
| 2015/0170985 A1 | 6/2015 | Wu et al. | |
| 2015/0228795 A1 | 8/2015 | Yang et al. | |
| 2016/0028936 A1 | 1/2016 | Saphier et al. | |
| 2018/0118398 A1* | 5/2018 | Li | H01L 21/67196 |

\* cited by examiner

AUTOMATIC IN-LINE INSPECTION SYSTEM

CROSS-REFERENCE TO RELATED APPLICATION

The present application claims priority to U.S. Provisional Patent Application No. 62/552,216, filed on Aug. 30, 2017, which is incorporated by reference herein in its entirety.

BACKGROUND

In the semiconductor integrated circuit (IC) industry, there is a continuing demand for smaller device dimensions and higher circuit packing densities. This demand has driven the semiconductor industry to develop new materials and complex processes. Manufacturing an IC at such dimensions and complexity generally uses advanced techniques to inspect the IC at various stages of the manufacturing process for quality control purposes.

For example, when a feature (e.g., a gate/drain/source feature of a transistor, a horizontal interconnect line, or a vertical via, etc.) is to be formed on a wafer, the wafer typically goes through a production line which comprises multiple processing stations typically using different process tools to perform various operations such as cleaning, photolithography, dielectric deposition, dry/wet etching, and metal deposition, for example. Prior to being transferred to a next step (e.g., a next processing station) in the production line, the wafer is typically inspected for defects.

In general, such an inspection is manually performed by a human using an optical instrument to determine the presence of defect(s) such as, parametric (e.g., line width), random (e.g., individual via), and area-dependent failures (e.g., "killer defect" particles) that may be caused by one or more malfunctioning processing stations along the production line. When a defect is detected as a result of such "manual" inspection, the wafer is generally removed from a current processing station before entering into a next processing station, which is typically known as an "offline inspection." Such an offline inspection disadvantageously causes various issues.

For example, a time-resource trade-off leads to a trade-off between an inspection resolution and a sampling rate, e.g., a high sampling rate (i.e., a high throughput of the inspection) is typically subjected to a low inspection resolution, and vice versa. Further, because of the "manual" operation, such an offline inspection often interrupts an automatic production line, which also increases the possibility of wafer contamination. Further, the off-line inspection often requires expensive inspection equipment, dedicated human resources and lab spaces.

Therefore, an "inline" inspection that does not require additional lab space and can automatically and effectively detect defects at low cost without significantly interrupting the production line or affecting its throughput has been desired by the IC industry. Despite this long felt need, no suitable systems meeting these requirements are available.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of an inline inspection system that comprises a high-resolution line scan camera. In some embodiments, such an inline inspection system can be integrated in a transfer station having a transfer conveyor configured to unload a wafer from a previous processing station or to load a wafer and transfer it to a next processing station. Moreover, in contrast to sampling only a few locations on the wafer for inspection, the line scan camera can scan the whole wafer surface in a line-by-line fashion during such wafer transferring process to determine whether a defect is present, subsequent to being unloaded from the previous processing station and prior to being loaded to the next processing station, in accordance with some embodiments. As such, in contrast to conventional offline manual inspection processes, such inline inspection processes provide high throughput without compromising a high inspection resolution (i.e., no trade-off between the sampling rate and the inspection resolution). Accordingly, the above-mentioned issues in the conventional offline inspection system may be advantageously avoided.

Figure 1:
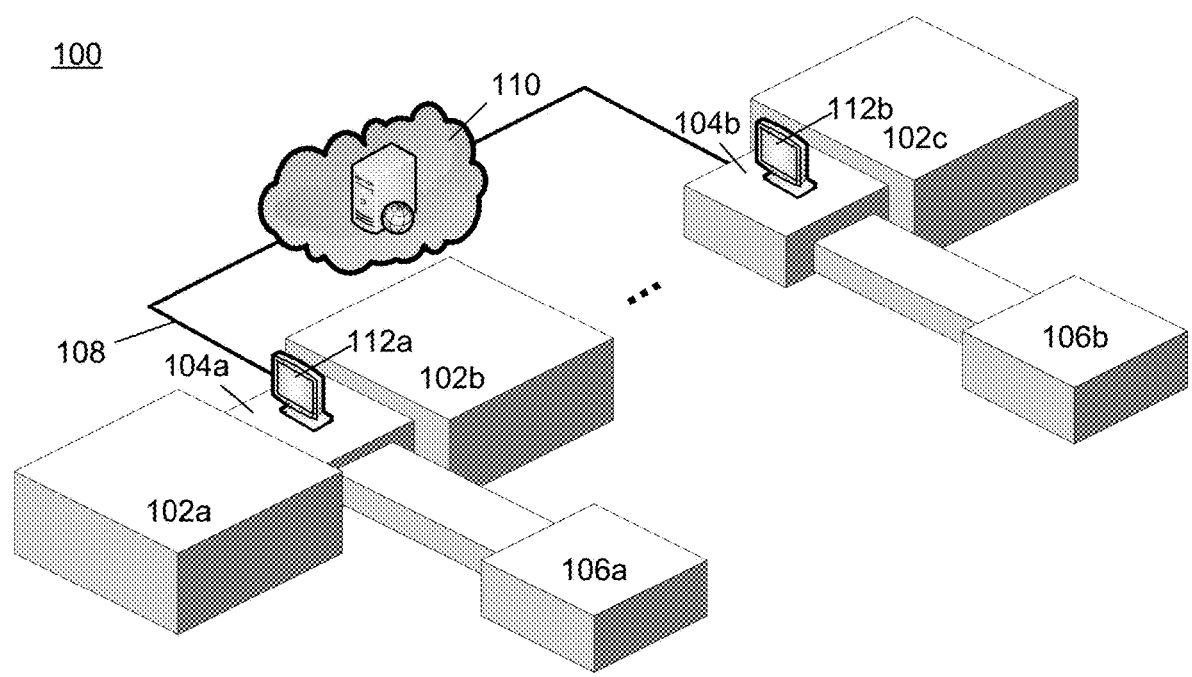
FIG. 1 illustrates a block diagram of a system integrating a plurality of inline inspection systems into a semiconductor manufacturing production line, according to some embodiments of the present disclosure.

FIG. 1 illustrates a block diagram of a system 100 integrating a plurality of inline inspection systems into a semiconductor manufacturing production line according to one or more embodiments of the present disclosure. It is noted that the system 100 is merely an example, and is not intended to limit the present disclosure. Accordingly, it is understood that additional operations may be provided before, during, and after the system 100 of FIG. 1, and that some other operations may only be briefly described herein.

Referring to FIG. 1, the system 100 comprises a plurality of processing stations 102a, 102b and up to 102c (collectively referred to as processing station(s) 102 herein), a plurality of inspection systems 104a and 104b (collectively referred to as inspection system(s) 104 herein) located between respective processing stations 102, and a plurality of stockers 106a and 106b (collectively referred to has stocker(s) 106 herein) coupled to respective inspection systems 104. Examples of IC manufacturing processes conducted in processing stations 102 include cleaning, photolithography, wet etching, dry etching, dielectric deposition, metal deposition, and any processes known in the art. At least one feature can be created in each processing station 102 including a metal contact, an etch trench, an isolation, a via, an interconnect line and the like.

At least two processing stations 102 are coupled to an intermediate inspection system 104, in which at least one wafer from one prior processing station 102 can be inspected before it is transported to the next processing station 102. For example, a processing station 102b is coupled to a prior processing station 102a through an inspection system 104a and is also coupled to a later processing station 102c through an inspection system 104b. At least one stocker 106 is coupled to each inspection system 104. For example, a stocker 106a is coupled to the inspection system 104a, in which a wafer with defects as determined by the inspection system 104a can be extracted from the production line and stored in the stocker 106a for reprocessing or rejection, instead of being transferred to the next processing station 102b.

As discussed in further detail below, in some embodiments, the inspection system 104 includes a wafer transport system (e.g., a conveyor) that transfers a wafer through the inspection station, a line scan camera, and a local computer with a storage unit and a display unit. For example, the wafer can be transferred on a conveyor in the inspection system 104a from processing station 102a to processing station 102b, or if a defect is detected to respective stocker 106a. While being transferred in the inspection system 104a, the surface of the wafer is imaged by the line scan camera. Data collected by the line scan camera can be stored in a storage unit of a local computer 112a followed by a preprocessing step. Examples of preprocessing can include reconstruction of the line images into a two-dimensional image of the wafer surface and various distortion corrections, as described in further detail below. As shown in FIG. 1, a second local computer 112b is coupled to the second inspection system 104b to store and preprocess data collected by the second inspection system 104b.

Each of the local computers 112a and 112b are generally or collectively referred to has local computer(s) 112 herein. The local computers 112 are each coupled to a remote computer resource 110 through a connection 108. In some embodiments, the connection 108 may include a Ethernet cable, an optical fiber, a wireless communication media, and/or other networks known in the art. It should be understood that other connections and intermediate circuits can be deployed between the local computers 112 and the remote computer resource 110 to facilitate interconnection.

In some embodiments, an image processing operation can be performed by the remote computer resource 110 to automatically compare design criteria with the collected image of the wafer surface in accordance with predetermined algorithms or rules concerning, e.g., line width, irregular shape, nonuniformity, and the like. In some embodiments, the remote computer resource 110 includes a computer network, servers, applications, and/or data centers, generally known as the "cloud" or cloud computing. Results and decisions from the remote computer resource 110 about whether the wafer contains defects are processed and transmitted back to the local computer 112 associated with a respective inspection system 104 through the connection 108. In some embodiments, the remote computer resource 110 may be unnecessary if the local computer 112 can perform the image processing and analysis locally. In some embodiments, various inspection results (e.g., size, density and distribution of defects and mapping of defects overlaid with design patterns) are displayed on a local display unit and, if the wafer is determined to be defective, a control signal is sent to the conveyor to transfer the wafer to a respective stocker 106. In some embodiments, a wafer that fails to meet a pre-defined threshold or criterion, and thus determined to be defective, is transferred by the conveyor in the inspection system 104a to a cassette in the stocker 106a for reprocessing or rejection. On the other hand, if the wafer is determined to be not defective meeting the pre-defined threshold or criterion, then it is transferred by the conveyor to the next processing station 102b for further processing. In some embodiments, the threshold may vary depending on the application and can be set by manufacturers.

Although the system 100 in the illustrated embodiment of FIG. 1 includes only three processing stations 102, two inspection systems 104, two stockers 106, two local computers 112 and one remote computer 110, it is understood that the illustrated embodiment of FIG. 1 is merely provided for illustration purposes. The system 100 may include any desired number of processing stations 102 with any desired number of inspection systems 104 and stocker 106 while remaining within the scope of the present disclosure. Furthermore, in some embodiments, an inspection system 104 can be coupled to two or more processing stations 102 and/or two or more stockers 106. In some embodiments, two or more inspection systems 104 may be located between two processing stations 102.

In some embodiments, a separate transfer chamber in the inspection station 104 can be coupled to a process chamber in the processing station 102. In some embodiments, for processes such as metal or dielectric deposition, for example, the inline camera of the inspection system 104 is separated from the deposition chamber of the processing station to protect the camera and other components of the inspection system 104 from deposition of materials, or extreme conditions, e.g., high temperature heating and ion bombardment. In some embodiments, the transfer chamber of the inspection system 104 can maintain a vacuum seal between two vacuum process chambers or purged with high purity inert gas (e.g., Ar and $N_2$) to provide an inert atmosphere for air sensitive wafers during the transferring process. In some embodiments, the inspection system 104 may be configured inside the process chamber of the processing station 102, if the process does not interfere with the inspection. Such an integration of inspection systems to an existing semiconductor manufacturing production line provides an inline inspection that can efficiently detect and map the defects of entire wafer, without relying on manual inspection or statistical sampling of the wafer surface. By mapping the defects of the wafer after each processing stage, as part of the inline manufacturing process, critical insights into process characteristics (e.g., tools and conditions) of each stage can be obtained while minimizing adverse effects on throughput.

As mentioned above, FIGS. 2A-2C illustrate a variety of perspective views of the inline inspection system 200 considering various space requirement, wafer size, and transferring mechanism, in accordance with some embodiments. These are, of course, merely examples and are not intended to be limiting.

Figure 2A:
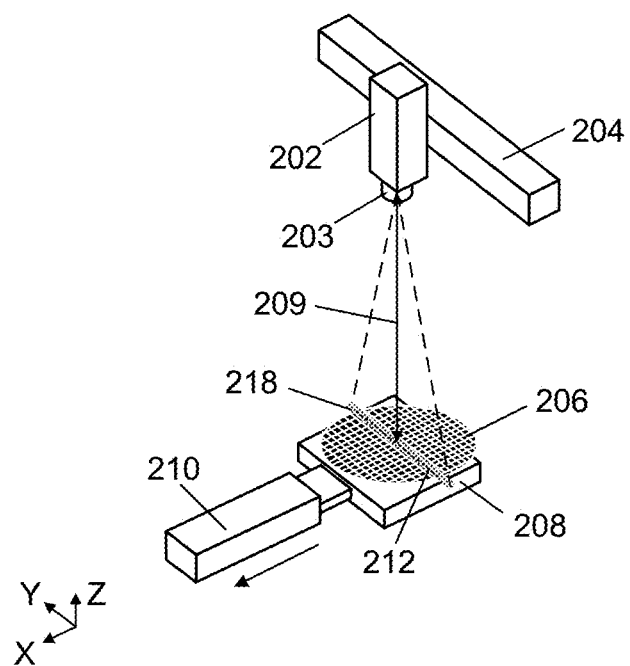
FIG. 2A illustrates a perspective view of an inspection system, in accordance with some embodiments.

FIG. 2A illustrates a perspective view of an inspection system 200A, in accordance with some embodiments. In one embodiment, a wafer 206 is secured by a suitable wafer holder 208 coupled to a conveyor, e.g., a motorized robotic transfer arm 210. The robotic transfer arm 210 is translatable in both the X and Y directions. In some embodiments, the robotic transfer arm 210 is also rotatable about a certain center in the X-Y plane. In the illustrated embodiment, the wafer holder 208 coupled to the robotic transfer arm 210 transfers the wafer 206 along the X axis at a constant speed during scanning.

In the embodiment shown in FIG. 2A, a line scan camera 202 with an imaging lens 203 is mounted on a frame 204 located at a certain working distance 209 from the surface of the wafer 206 in the vertical (Z) direction. In some embodiments, these three parts, i.e., 202, 203 and 204, are stationary. In some embodiments, a diffused illumination from a remotely located light source (not shown) can be used, which can provide sufficient light for the line scan camera 202 to capture high-resolution images of the wafer 206. In some embodiments, the position of the frame 204 and the line scan camera 202 relative to the wafer 106 can be adjusted for alignment purpose.

In some embodiments, instead of capturing an image of the entire wafer as a whole, the line scan camera 202 collects image data one scan line at a time. An image line 212, indicated by a short dashed line in FIG. 2A, is a line region where the reflected or scattered light from the surface of the wafer under inspection is collected by a light sensor in the line scan camera 202 through the imaging lens 203. In some embodiments, the field of view 218 of the line scan camera 202 in the Y direction, e.g., the maximum length of the image line 212, can be adjusted by the width of the light sensor in the line scan camera 202, the working distance 209, and the focal length of the lens 203. In some embodiments, the image line 212 is the overlap portion of the field of view 218 in Y direction and the surface of the wafer 206. For example, the width of imaging lens can be 25 millimeters (mm), which can provide a field of view 218 with a width of up to 215 mm in the Y direction and a sensor width of 14 mm. Therefore, the resolution in the Y direction, which has a unit in mm per pixel for a light sensor width of 1024 pixels per line, can be controlled by the working distance 209 taking into account the diameter of the wafer 206. In some other embodiments, the line scan cameras comprising light sensors with different width and numbers of pixels can be used and are within the scope of this disclosure. In some embodiments, the resolution that such system can provide is 9 micrometer.

In some embodiments, the line scan camera 202 includes a light sensor that can be based on a variety of technologies such as, for example, a charge-coupled detector (CCD), a complementary metal-oxide-semiconductor (CMOS), or a hybrid CCD/CMOS architecture. In some embodiments, the light sensor can be a mono or color sensor. In some embodiments, such light sensor can be configured to either work in a broad range of wavelengths or a narrow range of wavelengths e.g., ultraviolet light, visible light, infrared light, x-ray and/or other appropriate wavelengths. In some other embodiments, such light sensor can be configured to receive either reflected and/or scattered non-fluorescence light from a light source or a fluorescence light emitted by the defects or features due to an excitation by the light source.

In some embodiments, the wafer 206 includes a silicon substrate. Alternatively, the wafer 206 may include other elementary semiconductor material such as, for example, germanium. The substrate may also include a compound semiconductor material such as silicon carbide, gallium arsenide, indium arsenide, and indium phosphide. Furthermore, the wafer 206 may include an alloy semiconductor material such as silicon germanium, silicon germanium carbide, gallium arsenic phosphide, and gallium indium phosphide. Each material may interact differently with the incident light from the light source due to different material properties, e.g., refractive index and extinction coefficient, which can affect the design of the illumination source and the light sensor, e.g., wavelength, sensitivity and mode (e.g., scattered, reflected light or fluorescence light), as well as the speed of the conveyor.

The wafer 206 may contain at least one feature to be optically inspected. In some embodiments, the wafer 206 may include trenches from dry/wet etching of a dielectric material including fluorinated silica glass (FSG), phosphosilicate glass (PSG), borophosphosilicate glass (BPSG), polyimide, and/or other future developed low-k dielectric materials. In some embodiments, the wafer 206 can also include conductive features such as, for example horizontal interconnect lines or vertical vias from processes like chemical vapor deposition (CVD), physical vapor deposition (PVD), spin-on coating and the like. In some embodiment, the design of the illumination source, light sensor, and imaging lens 203 can be also affected by the physical dimension of these materials on the wafer 206, e.g., thickness and roughness, in combination with the material property of the wafer 206 and the materials on top, due to phenomena such as, for example interference effect and antireflection effect.

Figure 2B:
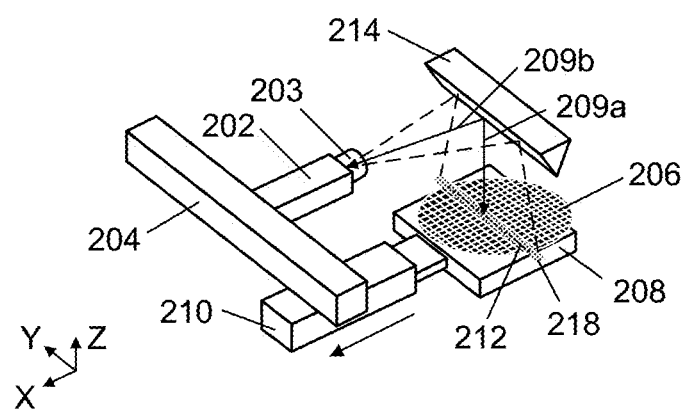
FIG. 2B illustrates a perspective view of an inspection system, which includes a reflective mirror, in accordance with some embodiments.

FIG. 2B illustrates a perspective view of an inspection system 200B which includes a reflective mirror 214, in accordance with some embodiments. In some embodiments, the reflective mirror 214 can reflect the non-fluorescent light and/or the fluorescent light from the image line 212 on the surface of the wafer 206 to the light sensor in the line scan camera 202 through lens 203. Since the optical pathway can be folded with a portion in the X direction parallel to the transfer direction of the wafer 206, the use of the reflective mirror 214 can allow the use of inspection system 200B in applications where a large space in the Z direction is not available, e.g., the total height of a transfer chamber is smaller than the summation of the working distance 109 and the length of the line scan camera 102. In some embodiments, the position in the X-Z plane and the tilt angle (i.e., rotation) along the Y axis of the reflective mirror 114 can be adjusted for alignment purpose. The configuration presented in FIG. 2B is merely for illustration purpose and is not intended to be limiting. For example, a plurality of reflective mirrors can be used to provide a desired optical path in order to direct the light to a desired direction. In some embodiments, the reflective mirror 214 is flat to prevent distortion of reflected light caused by the surface of the reflective mirror 214. For example, the reflective mirror 214 comprises a surface corrugation level in a range less than or equal to 20 micron/20 millimeter (μm/mm) and a surface curvature in a range equal to or less than 0.1 mm/100 mm.

Figure 2C:
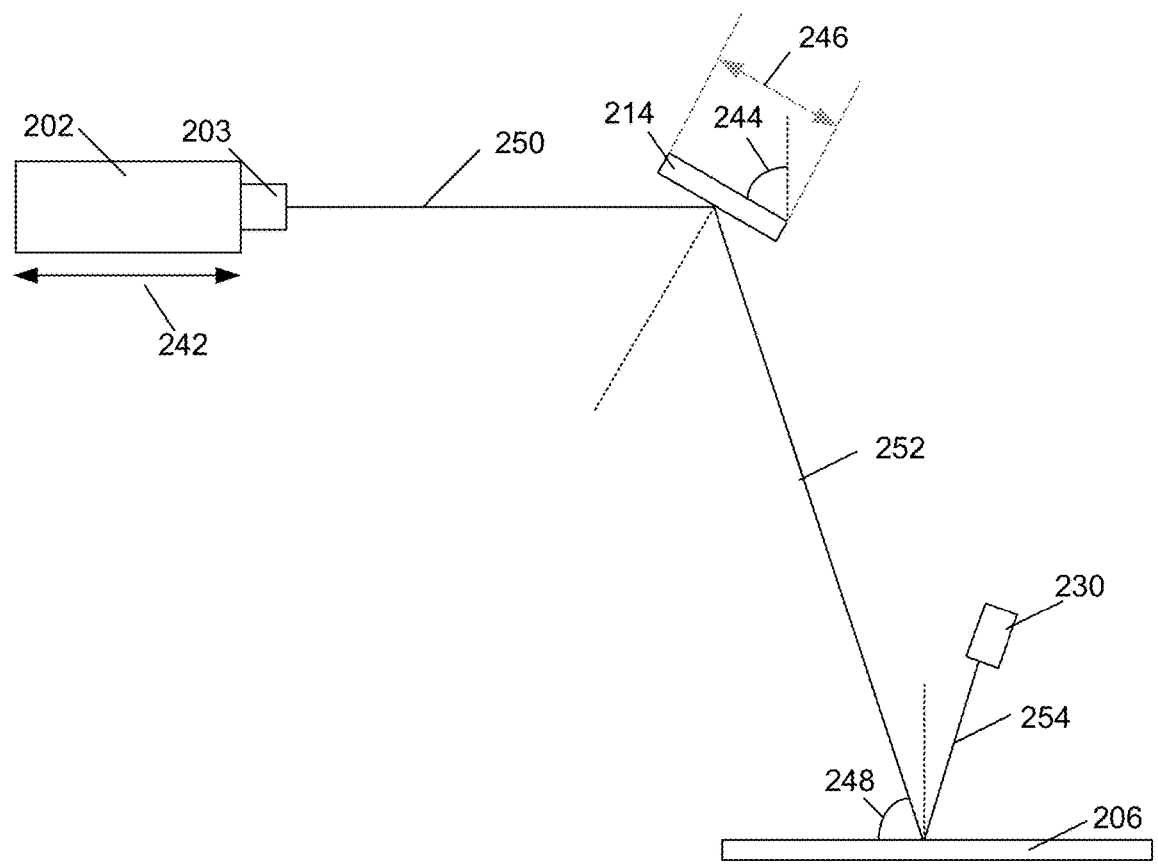
FIG. 2C illustrates a cross-sectional view of an inline inspection system which includes a reflective mirror, in accordance with some embodiments.

FIG. 2C illustrates a cross-sectional view of an inline inspection system 200C which includes a reflective mirror 214, in accordance with some embodiments. Because of the requirement for a wide field of view 218, when a large wafer is inspected especially within a limited space, a uniform intensity from a flood light source illumination becomes difficult. As mentioned above, since the image line 212 is the only portion of the wafer that needs to be uniformly illuminated for collecting line-scan images by the line scan camera 202, the illumination to the image line 212 can be from a line light source 230 having a narrow slit to direct a light beam. In some embodiments, the line light source 230 can include an array of light emitting diodes (LEDs) with a half bar converging line lens as an optical guide. Such a light source may be configured in the limited space while maintaining a uniform illumination to the image line 212 on the wafer 206.

In some embodiments, a distance 250 from one end of the lens 203 to a reflective surface of the mirror 214, where the light beam from the light source 230 is reflected, is less than or equal to 145 mm. In some embodiments, a distance 252 between the reflective mirror 214 and the surface of the wafer 206 where the light beam from the light source 230 is reflected is 400 mm. Further, a distance 254 between the end of the light source 230 and the surface of the surface of the wafer 206 is 65 mm. The light source 230 is further configured with an angle 248 relative to the surface of the wafer 206 so that the reflected light from the surface of the wafer 206 can reach the reflective mirror 214. The reflective mirror 214 is tilted away from the direction normal to the surface of the wafer 206 by an angle 244 so as to reflect the light from the surface of the wafer 206 into the light sensor 202. In some embodiments, the angle 248 is 75 degrees and the angle 244 is 52.5 degrees. In some embodiments, the angles 244 and 248 manually or automatically can be adjusted for alignment purposes through motors coupled to the holder of the reflective mirror 214 and the light source 230.

Figure 2D:
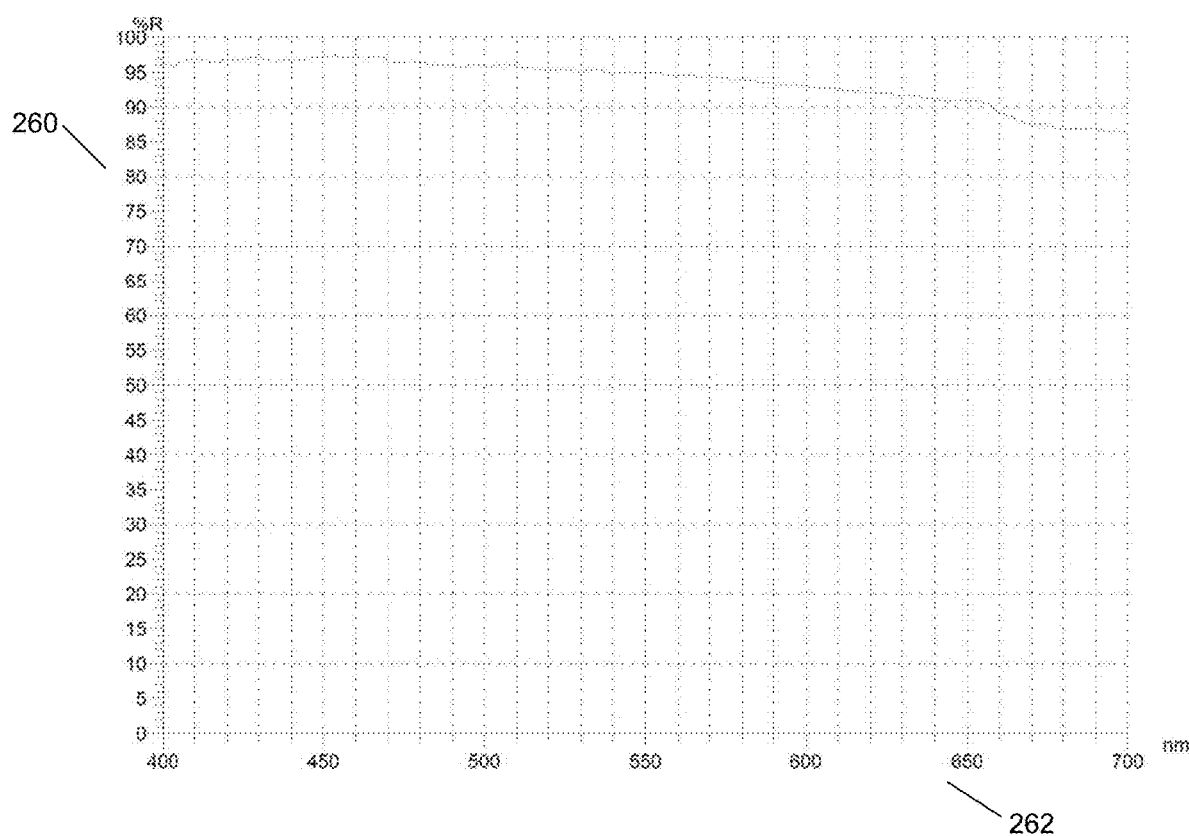
FIG. 2D illustrate a plot of reflectivity as a function of wavelength in a visible range (410-700 nm), in accordance with some embodiments.

FIG. 2D illustrate a plot 200D of reflectivity as a function of wavelength in a visible range (410-700 nm), in accordance with some embodiments. The reflectivity 260 at wavelengths 262 below 650 nm is greater than 90% and the reflectivity value 260 at wavelengths between 650 and 700 nm is greater than 85%.

Figure 2E:
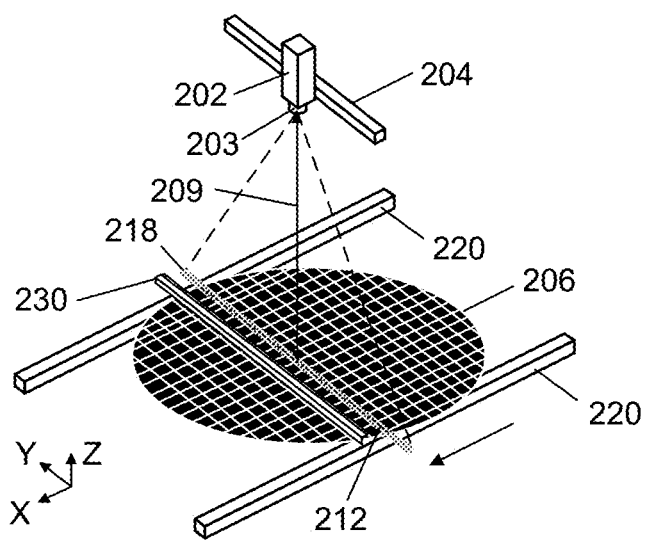
FIG. 2E illustrates a perspective view of an inline inspection system that can inspect a wafer having a large dimension, in accordance with some embodiments.

FIG. 2E illustrates a perspective view of an inline inspection system 200E that can inspect a wafer 206 having a large dimension (e.g., 152 mm in diameter), in accordance with some embodiments. In some embodiments, the light sensor in the line scan camera 202, the working distance 209, and the imaging lens 203 can be configured to assure the width of the field of view 218 in the Y direction is equal or greater than the diameter of the wafer 206. In some embodiments, the wafer 206 can be transported on a pair of tracks 220, as shown in FIG. 2C.

Because of the requirement for a wide field of view 218, when a large wafer is inspected especially within a limited space, a uniform intensity from a flood light source illumination becomes difficult. As mentioned above, since the image line 212 is the only portion of the wafer that needs to be uniformly illuminated for collecting line-scan images by the line scan camera 202, the illumination to the image line 212 can be from a line light source 230 having a narrow slit to direct a light beam. In some embodiments, the line light source 230 can include an array of light emitting diodes (LEDs) with a half bar converging line lens as an optical guide. Such a light source may be configured in the limited space while maintaining a uniform illumination to the image line 212 on the wafer 206. However, in accordance with various embodiments, various light sources suitable for various applications may be utilized. In another embodiment, an imaging lens 203 with a larger diameter, a smaller focal length, and/or a large refractive index can be used to provide a wide field of view 218 at a small working distance 209. To obtain a comparable resolution (mm per pixel) to that on a smaller wafer, a camera with a larger sensor size may be used. In some embodiments, the optical pathway can be redirected by a reflective mirror or a plurality of reflective mirrors e.g., an array of reflective mirrors (not shown) to accommodate the inspection system in certain applications.

In some embodiments, the line scan camera 202 is located close to a gate valve of a processing chamber. In some embodiments, the relative position between the line scan camera 202 and the light source 230 can affect the inspection criteria. For example, in case of using a linear light source 230 on a wafer 206 with a reflective surface, when the line scan camera 202 is off the angle of reflection, the reflective surface appears dark in the light sensor while the features and/or defects can scatter light and appear bright in the image. For another example, when the line scan camera 202 is within the angle of reflection of the incident light from the light source 230, the surface appears bright while the features and/or defects may appear darker or brighter depending on their reflectivity relative to the rest of the surface.

In some embodiments, the conveyor can be a transfer robot which consists of multiple joints, a single arm, and a stage. In some embodiments, the transfer robot can provide high-speed and high-accuracy wafer handling within a limited space. As discussed above, a surface inspection using the line scan camera 202 requires a linear motion of the wafer 206 in a direction perpendicular to the axis of the image line 212. In some embodiments, the inline inspection system 200 with the line scan camera 202 can be configured to focus on one portion of a wafer transfer pathway where such linear relative motion between the wafer 206 and the image line 212 can be provided by a combination of moving parts of the transfer robot (e.g., rotation of joints and linear motion of arm and the stage).

In some embodiments, such inspection system can be combined with other functional inspection processes either inline or offline for additional function yield tests, e.g., electrical conductivity measurements. Although the above-illustrated inline defect detection system includes only one line scan camera (e.g., 202 in FIGS. 2A-2C), any desired number of line scan cameras can be combined in the inspection system, e.g., working in different ranges of wavelength and simultaneously detect different defects (e.g., size, distribution, and materials), while remaining within the scope of the present disclosure.

Figure 3A:
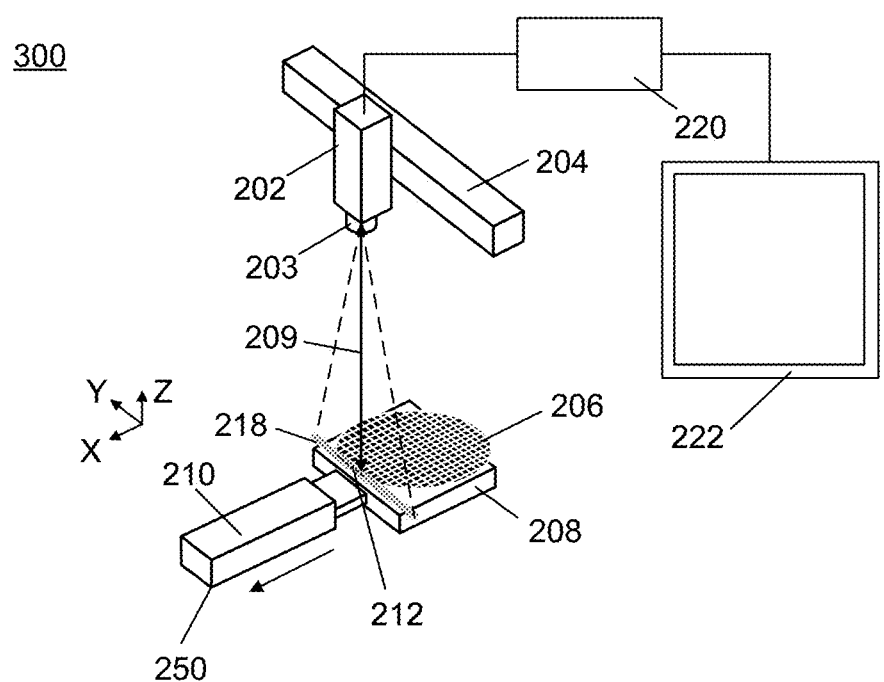
FIGS. 3A-3C illustrate perspective views of a system for scanning a wafer surface while the wafer is transferred by a conveyor through a field of view of a line scan camera, in accordance with some embodiments of the present disclosure.
Figure 3B:
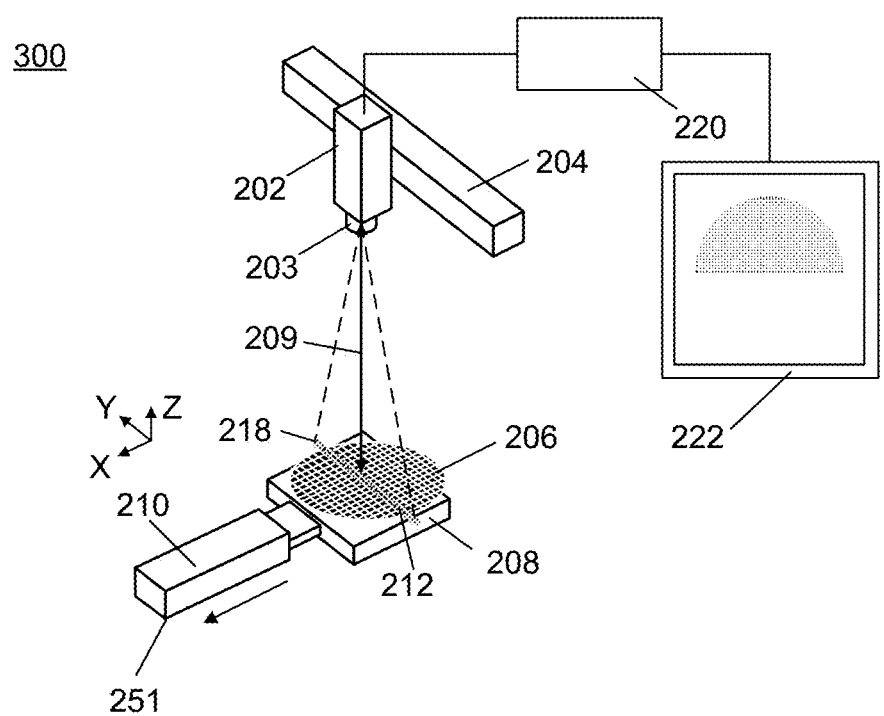
Figure 3C:
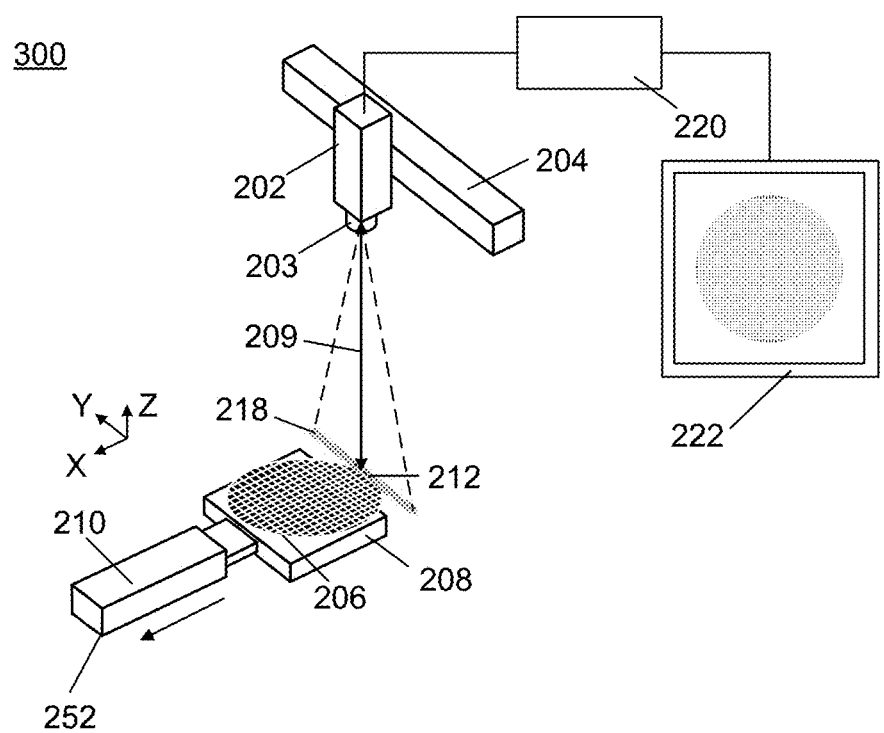

FIGS. 3A-3C illustrate perspective views of a system 300 for image recording when scanning the wafer surface while the wafer is transferred by the conveyor through the camera field of view, in accordance with some embodiments.

The system 300 first scans the wafer 206 at a first position 250 of the wafer 206 controlled by the conveyer 208/210, as shown in FIG. 3A. In the first position 250, the scan of the wafer surface is initiated, in accordance with some embodiments. As the wafer 206 enters the field of view 218 in Y direction, a recording cycle of a line scan image from the line scan camera 202 by a local computer 220 is initiated. In some embodiments, the recording can be also initiated by a position signal from an encoder that is located on a motor of the robotic transfer arm 210. In some embodiments, image data as the scanning progresses is shown on a display monitor 222 coupled to the local computer 220. As shown in FIG. 3A, at the beginning of the scanning process, no image data is yet available for display on the display monitor 222.

In some embodiments, such recording process of one single line of pixel from the line scan camera 202 to the local computer 220 is conducted in two steps, i.e., exposure and readout steps. In some embodiments, the recording process of a plurality of lines of pixels from the line scan camera 202 is conducted. In the first step, the line scan camera 202 collects a single line of pixels per exposure at one position which is initiated by the application of a trigger pulse to the camera, as discussed above. The trigger pulse also ends the exposure period and starts the second step of transferring the sensor image information to a readout register and finally out of the camera to the local computer, to complete the readout step. In some embodiments, the sensor image information is provided to the local computer 220 one line of pixels at a time. In some other embodiments, the line scan camera 202 collects a plurality of line of pixels per exposure at one position.

In some embodiments, the exposure time of an individual line at the image line 212 and the number of lines can be affected by the velocity of the wafer 206 and resolution requirement along the X axis in the wafer plane. In some embodiment, the exposure time may also be affected by illumination intensity, sensitivity of the light sensor, and type of defects being detected. In parallel with the first readout period, the line scan camera 202 continues with the next exposure step in a next cycle, while the robotic transfer arm 210 moves the wafer 206 to the next position.

The system 300 continues a second position 251 where a partial scan of the wafer surface of interest is completed, as shown in FIG. 3B, in accordance with some embodiments. In some embodiments, reconstruction of the image of the wafer surface under inspection is conducted based on a plurality of single line images through the local computer 220 and the surface image is then displayed on the display unit 222 in real time, as shown in FIG. 3B.

Once the surface of the wafer under inspection has been completely scanned at a third position 252, as illustrated in FIG. 3C, the local computer 220 then proceeds to reconstruct and preprocess the complete two-dimensional surface image to prepare the image for defect detection. In some embodiments, such preprocessing of the surface image includes offset correction, gain correction, distortion correction, adjusting contrast, and the like. In accordance with some embodiments, the reconstructed image is displayed on the display unit 222, as shown in FIG. 3C.

Figure 4:
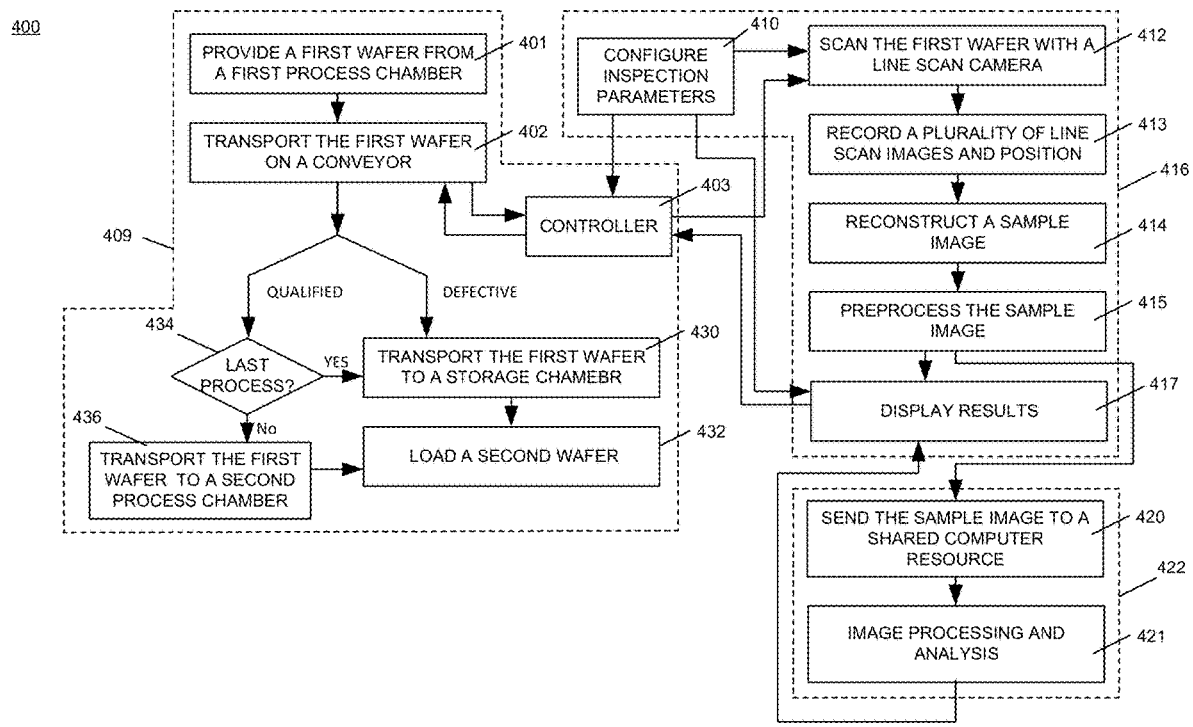
FIG. 4 illustrates a flowchart of a method of inline inspection systems, in accordance with some embodiments of the present disclosure.

FIG. 4 illustrates a flowchart of a method 400 of inline inspection of a wafer surface during manufacturing of integrated circuits on the wafer, in accordance with some embodiments. The method 400 comprises three sub functional blocks performed by a mechanical operation system 409, a local inspection system 416, and a remote computer 422, respectively, as indicated by corresponding dashed lines in FIG. 4.

The method 400 starts at operation 401 which includes providing a first wafer from a first processing station. The method continues with operation 402 in which the first wafer is transferred on a conveyor to an inspection station. In some embodiments, this conveyor can be a robotic transfer arm, a belt conveyor, and the like, which can provide motions such as, for example horizontal, vertical, linear, rotation, and a combination thereof. In some embodiments, the conveyor can handle a variety of substrates such as, for example, thin, large, film frame, glass, grooved, or the like. In some embodiments, the conveyor may transfer wafers between cassettes, stages and/or chambers. In some embodiments, a controller 403 communicates with encoders on the conveyor and sends trigger signals to the line scan camera in the local inspection system 416.

The method 400 continues to operation 410 in which inspection parameters are configured. In some embodiment, this configuration includes a process of writing an inspection recipe or recalling an existing recipe to an inspection operation 416, which contains inspection system parameter settings for a particular type of substrate, feature, or defect to be inspected. In some embodiments, operation 410 also includes configuration of the controller which controls the motion of the conveyor, e.g., speed and direction. In some embodiments, inspection parameters include trigger criteria, inspection resolution, line frequency, pixel frequency, total acquisition time, illumination intensity, moving speed of conveyor, size of wafer, and/or other suitable parameters.

The method 400 continues to operation 412 in which a surface of the first wafer is scanned by a line scan camera, while being transported by the conveyor at a constant speed along a direction perpendicular to the line scan direction, as discussed above with respect to FIGS. 2 and 3, for example. In some embodiments, the line scanning can be triggered by the controller 403 which acquires position parameters from the encoder located on the conveyor.

The method 400 continues to operation 413 where a plurality of line scan images are recorded by the light sensor in the line scan camera according to the method 300 illustrated in FIG. 3. In some embodiments, the plurality of line scan images is converted from analog signals to digital signals and stored in a local computer, followed by operations 414 and 415, during which a sample image is reconstructed based on the plurality of line scan images and preprocessed once a scanning of the surface of the first wafer is completed. In some embodiments, such operations 414 and 415 include at least one of the processes such as, for example, offset correction, gain correction, distortion correction, adjusting contrast, and the like.

The method 400 continues to operation 417 in which the preprocessed sample image can be displayed on a local display monitor which is coupled to a local computer. In some embodiments, the display monitor can be also a touch screen for inputting and displaying inspection parameters. In some embodiments, the preprocessed sample image is compared to references, design criteria and predefined threshold to conduct a wafer-scale mapping of defects by the remote computer 422 so as to determine the detect type and distribution. Results are then transmitted back to the local computer to command the controller 403 to control the conveyor so that the wafer can be reprocessed, rejected or move on to a next process.

In some embodiments, the line speed of the line scan camera is determined by the speed of the conveyor. In another embodiment, the resolution requirement of the line scan camera can be determined by the type of defects that are interested or are potentially introduced in a respective step of the manufacturing production line.

The method 400 continues to operation 420 in which the preprocessed sample image is sent to a remote computer 422. In some embodiments, the sample image is then processed during operation 421 to characterize the size and distribution of defects, and are compared with the design criteria of the device, such as size, shape, location and color to classify the defects into pre-defined categories. In some embodiments, the design criteria can vary between various steps within the production line with different layout characteristics. In some embodiment, the image processing and analysis system 421 may first identify the boundary of each die. In some embodiment, sensitivity of the system can be adjusted by the resolution of the camera. In some embodiments, the remote computer 422 can also decide to reject, reprocess or move on the first wafer based on the design criteria associated with the process information. A completed processed surface image may be transmitted back to the local computer.

The results are then transmitted back to the local computer for display through which a control signal can also be provided back to the conveyor. If the first wafer is defective and has to be removed from the production line, the method 400 continues to operation 430 in which the first wafer is transported to a stocker by the conveyor followed by operation 432 in which a second wafer is loaded by the conveyor to the inspection station for inspection. If the first wafer is determined to be not defective such that it can continue its further processing, the method 400 continues to operation 434. In some embodiments, when the first (i.e., current) processing station is the last processing station in the production line, the method 400 continues to operations 430 and 432, as discussed above. In other embodiments, when the first (i.e., current) processing station is not the last one, the method 400 continues to operation 436 in which the first wafer is transported to a second (i.e., next) processing station followed by operation 432 in which a second wafer is provided from the first processing station. Therefore, an automatic inline inspection and wafer categorization can be achieved.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the inventive concepts, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

In an embodiment, a method for inline detection of defects on a semiconductor wafer surface during a semiconductor device manufacturing process, the method comprising: automatically transporting the wafer from a first processing station to an inspection station; scanning a wafer surface using a camera in the inspection station; generating at least one image of the wafer surface; analyzing the at least one image to detect defects on the wafer surface based on a set of predetermined criteria; if the wafer is determined to be defective, automatically transporting the wafer from the inspection station to a stocker; and if the wafer is determined to be not defective, automatically transporting the wafer to a second processing station for further processing in accordance with the semiconductor device manufacturing process.

In another embodiment, an inspection station for inline detection of defects on a semiconductor wafer surface, the inspection station coupled to a first processing station, the inspection station comprising: a conveyor configured to automatically transport the semiconductor wafer from the first processing station to the inspection station; a camera configured to scan a surface of the semiconductor wafer and generate at least one image of the surface; and at least one processor configured to receive the at least one image from the camera and analyze the at least one image to detect defects on the surface based on a set of pre-determined criteria, wherein the conveyor is further configured to automatically transport the wafer from the inspection station to either the second processing station if the wafer is determined to be not defective or a stocker if the wafer is determined to be defective.

Yet, in another embodiment, A system for inline detection of defects on a semiconductor wafer surface during a semiconductor device manufacturing process, the system comprising: a first processing station for performing a first semiconductor manufacturing process; a second processing station for performing a second semiconductor manufacturing process; an inspection station coupled between the first and the second processing station for transporting a semiconductor wafer between the first and the second processing stations, wherein the inspection station comprises: a conveyor configured to automatically transport the semiconductor wafer from the first processing station to the inspection station; a reflective mirror to redirect an optical pathway between the camera and the wafer surface, wherein the reflective mirror has a surface corrugation level and a surface curvature, wherein the surface corrugation level is equal to or smaller than 20 μm/20 mm and the surface curvature is equal to or smaller than 0.1 mm/100 mm; a camera configured to scan a surface of the semiconductor wafer and generate at least one image of the surface; and at least one processor configured to receive the at least one image from the camera and analyze the at least one image to detect defects on the surface based on a set of pre-determined criteria, wherein the conveyor is further configured to automatically transport the wafer from the inspection station to either the second processing station if the wafer is determined to be not defective or a stocker if the wafer is determined to be defective.

What is claimed is:

1. A method for inline detection of defects on a semiconductor wafer surface during a semiconductor device manufacturing process, the method comprising:
   transporting the wafer from a first processing station to an inspection station;
   scanning a wafer surface using a camera in the inspection station;

generating at least one image of the wafer surface;
analyzing the at least one image to detect defects on the wafer surface based on a set of predetermined criteria;
if the wafer is determined to be defective, transporting the wafer from the inspection station to a stocker; and
if the wafer is determined to be not defective, transporting the wafer to a second processing station for further processing in accordance with the semiconductor device manufacturing process;
redirecting an optical pathway between the camera and the semiconductor wafer using a reflective mirror, wherein the reflective mirror has a surface corrugation level and a surface curvature, wherein the surface corrugation level is equal to or smaller than 20 µm/20 mm and the surface curvature is equal to or smaller than 0.1 mm/100 mm; and
illuminating the wafer surface using a light source.

2. The method of claim 1, wherein the transporting comprises using a robotic transfer arm to transport the semiconductor wafer between the first processing station and the inspection station.

3. The method of claim 2, wherein the robotic transfer arm is coupled to a holder for holding the semiconductor wafer.

4. The method of claim 1, wherein the camera comprises a line scan camera which scans the semiconductor wafer surface one pixel line at a time.

5. The method of claim 1, wherein the transporting comprises using a conveyor.

6. The method of claim 1 wherein the light source comprises a line light source that only illuminates a line portion of the wafer surface at one time.

7. The method of claim 1, wherein the generating of at least one image comprises:
providing pixel data from the camera to a local processor coupled to the camera;
preprocessing the pixel data to generate the image of the wafer surface; and
displaying the image of the wafer surface on a display monitor coupled to the local processor.

8. The method of claim 7, further comprising:
transmitting data representative of the image of the wafer surface to a remote computer; wherein the analyzing the at least one image of the wafer surface is conducted by the remote computer; and
receiving results of the analyzing from the remote computer at the local computer, wherein the transporting of the semiconductor wafer to either the second processing station or the stocker is based on the results.

9. An inspection station for inline detection of defects on a semiconductor wafer surface, the inspection station coupled to a first processing station, the inspection station comprising:
a conveyor configured to transport the semiconductor wafer from the first processing station to the inspection station;
a camera configured to scan a surface of the semiconductor wafer and generate at least one image of the surface; and
at least one processor configured to receive the at least one image from the camera and analyze the at least one image to detect defects on the surface based on a set of pre-determined criteria,
wherein the conveyor is further configured to automatically transport the wafer from the inspection station to either the second processing station if the wafer is determined to be not defective or a stocker if the wafer is determined to be defective.

10. The system of claim 9, wherein the conveyor comprises a robotic transfer arm.

11. The system of claim 10, wherein the robotic transfer arm is coupled to a holder for holding the wafer during transporting between the stations.

12. The system of claim 9, wherein the camera comprises a line scan camera which automatically scans the wafer surface one pixel line at a time.

13. The system of claim 9, further comprising:
a reflective mirror to redirect an optical pathway between the camera and the wafer surface, wherein the reflective mirror has a surface corrugation level and a surface curvature, wherein the surface corrugation level is equal to or smaller than 20 µm/20 mm and the surface curvature is equal to or smaller than 0.1 mm/100 mm; and
a light source to illuminate the wafer surface.

14. The system of claim 13, wherein the light source comprises a line light source that only illuminates a line portion of the wafer surface at one time.

15. The system of claim 9, wherein the at least one processor coupled to the camera is further configured to:
receive a pixel data from the camera;
preprocess the pixel data to generate at least one image of the wafer surface; and
display the image of the wafer surface on a display monitor.

16. The system of claim 15, wherein the at least one processor comprises:
a local processor; and
a remote computer configured to:
receive the image of the wafer surface;
analyze the image of the wafer surface; and
transmit an analysis result to the local processor.

17. A system for inline detection of defects on a semiconductor wafer surface during a semiconductor device manufacturing process, the system comprising:
a first processing station for performing a first semiconductor manufacturing process;
a second processing station for performing a second semiconductor manufacturing process;
an inspection station coupled between the first and the second processing station for transporting a semiconductor wafer between the first and the second processing stations, wherein the inspection station comprises:
a conveyor configured to automatically transport the semiconductor wafer from the first processing station to the inspection station;
a reflective mirror to redirect an optical pathway between the camera and the wafer surface, wherein the reflective mirror has a surface corrugation level and a surface curvature, wherein the surface corrugation level is equal to or smaller than 20 µm/20 mm and the surface curvature is equal to or smaller than 0.1 mm/100 mm;
a camera configured to scan a surface of the semiconductor wafer and generate at least one image of the surface; and
at least one processor configured to receive the at least one image from the camera and analyze the at least one image to detect defects on the surface based on a set of pre-determined criteria,
wherein the conveyor is further configured to automatically transport the wafer from the inspection station to either the second processing station if the wafer is determined to be not defective or a stocker if the wafer is determined to be defective.

18. The system of claim 17, wherein the conveyor comprises a robotic transfer arm.

19. The system of claim 17, wherein the camera comprises a line scan camera which scans the wafer surface one pixel line at a time.

20. The system of claim 17, wherein the at least one processor comprises:
   a local computer; and
   a remote computer configured to:
   receive the image of the wafer surface;
   analyze the image of the wafer surface;
   generate results of the analyzing; and
   transmit the results to the local computer wherein the automatically transporting of the wafer to either the second processing station or the first stocker is conducted based on the results.

\* \* \* \* \*